(12) United States Patent
Etoh (10) Patent No.: US 11,222,910 B2
(45) Date of Patent: Jan. 11, 2022

(54) HIGH-SPEED IMAGE SENSOR (71) Applicant: Takeharu Etoh, Osaka (JP)

(72) Inventor: Takeharu Etoh, Toyonaka (JP)

( * ) Notice: Subject to any disclaimer, the term of this patent is extended or adjusted under 35 U.S.C. 154(b) by 0 days.

(21) Appl. No.: 16/866,699

(22) Filed: May 5, 2020

(65) Prior Publication Data

US 2020/0266222 A1 Aug. 20, 2020

Related U.S. Application Data (63) Continuation of application No. PCT/JP2018/040557, filed on Oct. 31, 2018.

(30) Foreign Application Priority Data

Nov. 7, 2017 (JP) .............................. JP2017-226290
Mar. 9, 2018 (JP) .............................. JP2018-063097
Oct. 1, 2018 (JP) .............................. JP2018-197034

(51) Int. Cl.
*H01L 27/14* (2006.01)
*H01L 27/146* (2006.01)
(Continued)

(52) U.S. Cl.
CPC .... *H01L 27/14605* (2013.01); *H01L 27/1464* (2013.01); *H01L 27/14818* (2013.01); *H04N 5/378* (2013.01)

(58) Field of Classification Search
CPC ......... H01L 27/14605; H01L 27/14607; H01L 27/1464
See application file for complete search history.

(56) References Cited

U.S. PATENT DOCUMENTS 9,503,663 B2 11/2016 Etoh et al.
10,411,053 B2 * 9/2019 Yokogawa .......... H01L 27/1463
(Continued)

FOREIGN PATENT DOCUMENTS

JP 2009-88030 4/2009
JP 2009-158798 7/2009
(Continued)

OTHER PUBLICATIONS

Takeharu G. Etoh, et al., "Toward One Giga Frames per Second—Evolution of in-Situ Storage Image Sensors", Sensors, 13(4), 2013, p. 4640-4658.
(Continued)

*Primary Examiner* — Kevin K Pyo
(74) *Attorney, Agent, or Firm* — Wenderoth, Lind & Ponack, L.L.P.

(57) ABSTRACT

A backside-illuminated multi-collection-gate image sensor is expected to achieve ultra-high-speed imaging. Signal electrons generated by incident light are collected to the pixel center of the front side and distributed to multiple collection gates placed around the center at a very short time interval. The temporal resolution is measured by the spread of arrival times of signal electrons to a collection gate. The major cause of the spread is mixing of signal electrons generated near the pixel border travelling a longer horizontal distance to the pixel center and those generated near the pixel center. Suppression of the horizontal travel time effectively decreases the standard deviation of the distribution of the arrival time. Therefore, devices to suppress the effects of the horizontal motion are introduced, such as a pipe-like photoelectron conversion layer with a much narrower cross section than the pixel area and a funnel-like photoelectron conversion layer.

18 Claims, 8 Drawing Sheets

(51) Int. Cl.
*H04N 5/378* (2011.01)
*H01L 27/148* (2006.01)

(56) References Cited

U.S. PATENT DOCUMENTS

| | | |
|---|---|---|
| 2011/0174958 A1 | 7/2011 | Weststrate et al. |
| 2014/0362268 A1 | 12/2014 | Etoh et al. |
| 2017/0110493 A1 | 4/2017 | Yokogawa |

FOREIGN PATENT DOCUMENTS

| | | |
|---|---|---|
| JP | 2011-526070 | 9/2011 |
| JP | 6188679 | 8/2017 |
| WO | 2007/138679 | 12/2007 |
| WO | 2013/129559 | 9/2013 |
| WO | 2015/133350 | 9/2015 |
| WO | 2015/190318 | 12/2015 |

OTHER PUBLICATIONS

Takeharu G. Etoh, et al., "The Theoretical Highest Frame Rate of Silicon Image Sensors", Sensors, 17(3), 2017.
C. Zhang, et al., "Pixel-parallel localized driver design for a 128 x 256 pixel array 3D lGfps image sensor", Proc. of SPIE vol. 10328, Selected Papers from the 31st International Congress on High-speed Imaging and Photonics, 10328-07. Feb. 20, 2020.
International Search Report (ISR) dated Jan. 15, 2019 in International (PCT) Application No. PCT/JP2018/040557.

\* cited by examiner

HIGH-SPEED IMAGE SENSOR

FIELD OF THE INVENTION

The present invention relates to high-speed imaging technology.

An existing silicon image sensor can capture consecutive images in one shot at the frame interval of about 10 nanoseconds (ns). Faster imaging with a frame interval down to 100 pico-seconds (ps), which is 1/100 of the shortest frame interval of the existing image sensors, is enabled by the invention. Image sensors with this such short temporal resolution may be used in scientific and industrial measurement apparatuses based on lifetime measurements, such as fluorescence lifetime imaging microscopy (FLIM) for observation of activities in cells, and time-of-flight (TOF) measurements, such as a 3-dimensional light detection and ranging sensor (LIDAR).

BACKGROUND OF THE INVENTION

1. Structure and Function of Backside-Illuminated Multi-Collection-Gate Image Sensors A Backside-Illuminated Multi-Collection-Gate image sensor (BSI MCG image sensor) including an array of pixels for ultra-highspeed imaging is disclosed in Patent Literature 1 and Patent Literature 2, and Non-Patent Literature 1.

Figure 1:
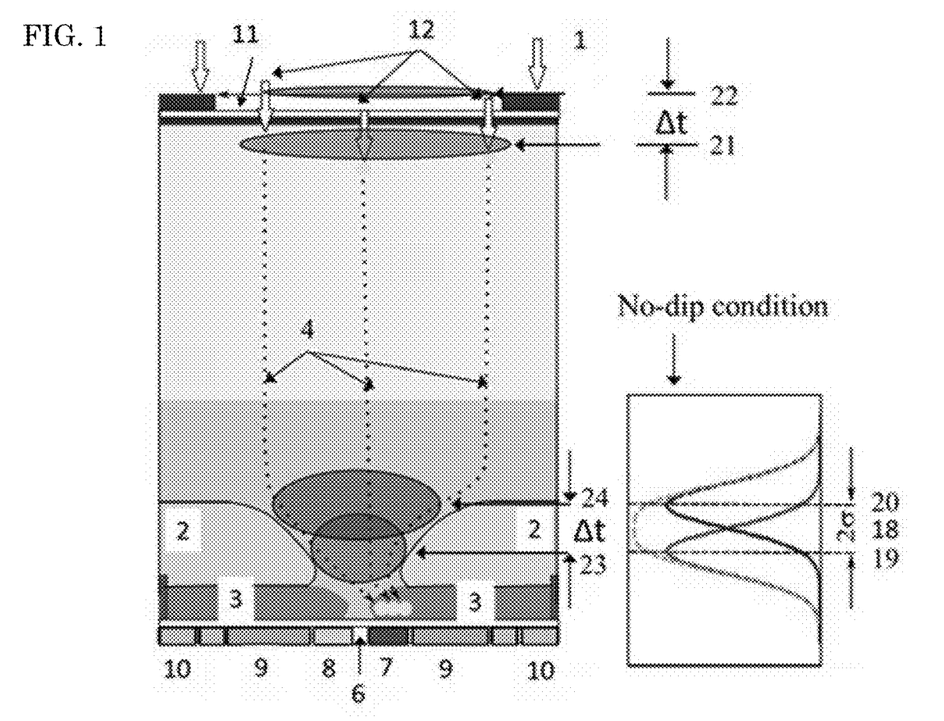
FIG. 1 is a cross-sectional view of a BSI MCG image sensor, and a view of superposed double Gaussian distributions.

FIG. 1 is a schematic diagram of a pixel of a BSI MCG image sensor, showing its vertical cross section 1. The pixel includes a photoreceptive layer 11, a p-well 2 with a hole at the center and a functional diffusion layer 3. A potential barrier made by the p-well 2 prevents signal charges 4 generated in the photoreceptive layer 11 above the p-well 2 from migrating to the functional diffusion layer 3 beneath the p-well 2.

Figure 2:
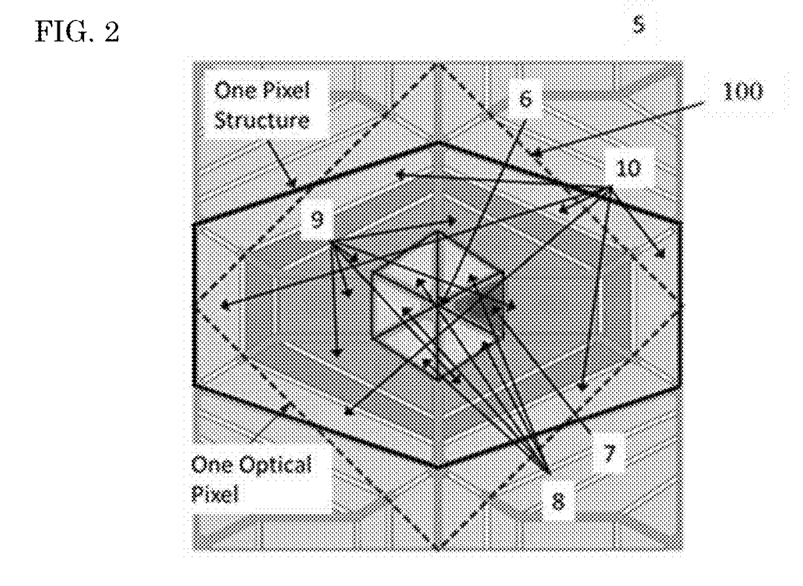
FIG. 2 is a plan view of a BSI MCG image sensor.

FIG. 2 shows a planar structure 5 on a front side of the pixel. Around the center 6 of the front side, a plurality of charge collection devices 7 and 8 are placed radially.

A high voltage VH is applied to the charge collection device 7, and a low voltage VL is applied to the other charge collection devices 8. A backside voltage VB is applied to the backside of the pixel. In an image capturing operation, the VH is applied to the charge collection devices at a very short time interval in turn, and the VL is applied to the remaining all charge collection devices in turn.

The image sensor shown in FIG. 2 further includes a plurality of charge storage devices 9 each connected to one of the charge collection devices, and to charge readout devices 10. After an image capturing operation is stopped, image signals containing a packet of the signal charges in the charge storage devices are transferred to the outside of the photoreceptive area through the charge readout devices 10.

Figure 3:
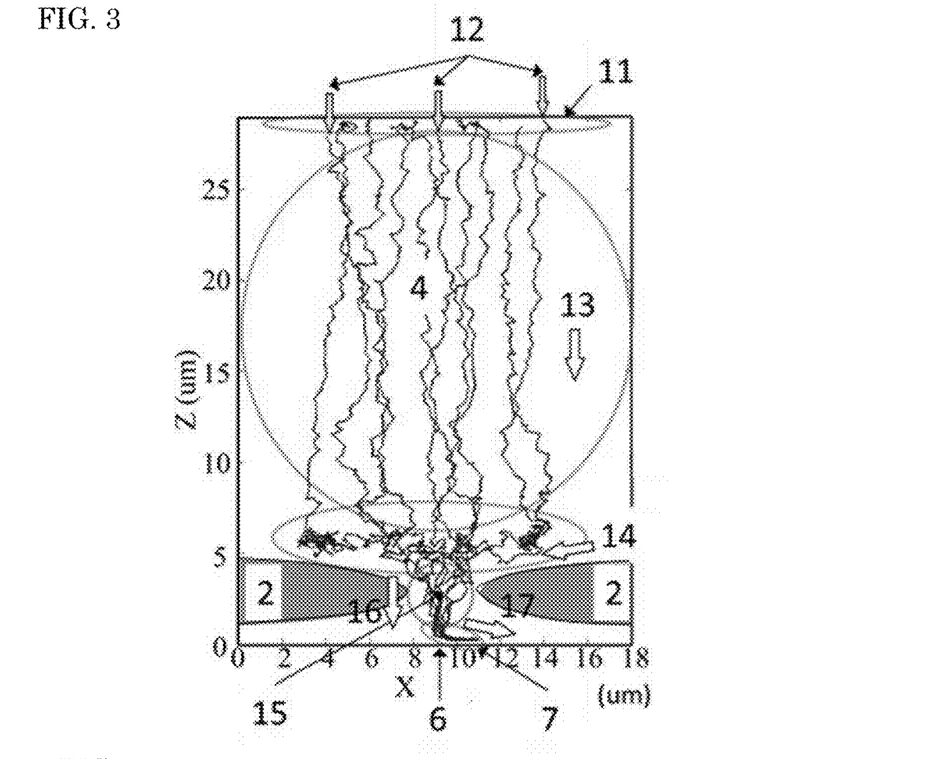
FIG. 3 is a graph showing the trajectories of signal electrons in a BSI MCG image sensor.

FIG. 3 shows example trajectories of signal charges (in this case, signal electrons) generated by light 12 incident to the backside of the image sensor arriving at one of the charge collection devices, which are simulated by Monte Carlo simulation.

For a test sensor of the MSI MCG image sensor, the signal charges are assumed to be electrons. The voltages are specified as VB=−20 V, VH=0 V, and VL=−3 V. In this condition, a channel beneath the charge collection device to which the VH is applied is 0 V. The thickness of the image sensor is 28 micrometers. Therefore, an electric field between the backside and the front side is 20 V/28 micrometers (0.71 V/micrometers=7.1 kV/cm).

For high-speed imaging, an electron as a signal charge is advantageous over a hole, since the mobility of an electron is much higher than that of a hole. Hereafter, a signal charge is assumed to be an electron, and the types of the semiconductors and the polarities of the voltages are selected to fit the sensor structure for an electron as a signal charge. However, a hole can be used as a signal charge by replacing n-type semiconductor elements of the image sensor in the following description with p-type semiconductor elements, and reversing electric polarities of the voltages applied to the electrodes.

As shown in FIG. 3, a signal electron 4 vertically moves with a random motion in the downward direction 13 by a difference between the VB, and the VH applied to one of the charge collection devices 7. Then, the signal electron moves to the center of the pixel in a substantially horizontal direction with a very small inclination over the p-well 2, to the center of the front side in a vertical direction 16 through the hole 15 of the p-well, and, then, to one of the charge collection devices 7 in an inclined direction.

The VH applied to the charge collection devices in turn at a very short time interval allows capturing of N consecutive frames of images, where N is the number of charge collection devices.

2. Temporal Resolution of the BSI MCG Image Sensor

The temporal resolution of the image capturing is represented by the spread of the arrival time of a signal electron to one of the charge collection devices.

FIG. 1 shows two light pulses, each instantaneously arriving at the backside of the image sensor with a time difference of dt. The pulses include a first group of photons 21 and a second group of photons 22. The first group of photons 21 generates a first group of signal electrons 23, and the second group of photons 22 generates a second group of signal electrons 24. These electrons 23 and 24 arrive at the front side, keeping the average time difference of dt and spreading due to mixing and diffusion.

A sum of the ordinates of two Gaussian distributions with different averages 19 (m1) and 20 (m2), where m2>m1, and the same standard deviation s shows two distinctive peaks for (m2−m1)>2s 18. However, for (m2-m1)<2s, the peaks merge into one peak without a dip at the center and cannot be separately distinguished. The condition (m2-m1)=2s is named "no-dip condition", which can be used to define the theoretical temporal resolution limit.

The spread of the signal electrons can have four causes.

A first cause is an exponential distribution of the penetration depth of incident light to the photoreceptive layer. An electron generated in a shallower site travels a longer distance, taking a longer time, and vice versa. The distributed depth of the generation sites of signal electrons result in a large spread of the arrival time due to mixing of such signal electrons traveling different distances.

A second cause is diffusion due to a vertical component of random motions of the signal electrons.

Due to mixing and diffusion, signal electrons undergo dispersion.

A third cause is horizontal mixing of the signal electrons due to their different travel distances in the horizontal direction over the p-well. Signal electrons generated by light incident to the pixel border travel a longer distance than signal electrons generated by light incident to the center of the pixel. The photons of the incident light randomly distribute all over the backside. The travel distance of a photon generated near the pixel border to the center is a half of the pixel size. The distance of a photon generated at the center of the backside is 0.

A fourth cause is diffusion due to a horizontal random motion.

Even light incident to the center of the backside causes spread of signal electrons due to their horizontal random motion, during the vertical travel to the front side before gathering again over the p-well to the center hole.

The distribution of the incident angle of light to the backside also causes a horizontal spread of the signal electrons.

Figure 4:
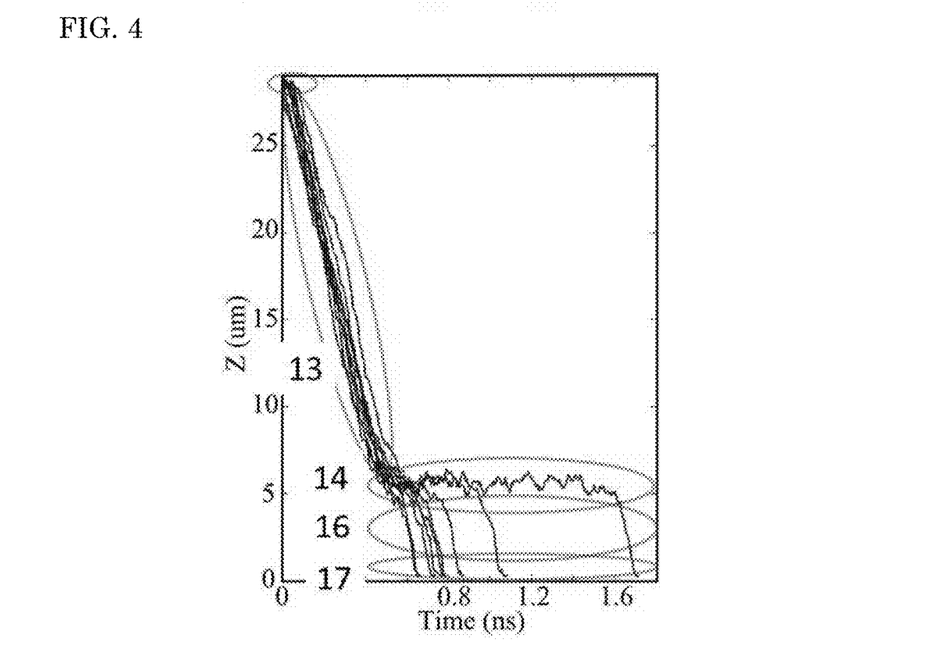
FIG. 4 is a graph showing the travel time and the arrival depth of signal electrons.

As shown in FIG. 4, the major cause of the spread of the arrival time of the signal electrons is mixing due to their horizontal motion over the p-well.

The effects of the horizontal mixing and diffusion can be reduced by modification of the design.

The effects of the distribution of the incident angle of light can also be suppressed. For example, in a microscopic optical system, incident light can be directed parallel to the optical axis.

On the other hand, vertical mixing due to the different penetration depth and vertical diffusion due to the vertical component of the random motion cannot be reduced.

3. Temporal Resolution of Image Sensors

The inventor of this application has theoretically derived the temporal resolution limit, assuming an infinitesimally narrow pixel in which no horizontal motion exists (Non-Patent Literature 2). For 550-nm light incident to a silicon photoreceptive layer, the theoretical temporal resolution limit is 11.1 ps (90.1 Gfps).

The expression on the temporal resolution limit is a counterpart of the expression on the spatial resolution limit proposed by Lord Rayleigh.

A first condition assumed in deriving the temporal resolution limit is no horizontal motion. It is impossible to eliminate the effects of the distribution of the generation site and a vertical component of the random motion of a photoelectron on the spread of the arrival time. This is a fundamental condition for the deriving the expression of the temporal resolution limit. In addition, the analysis incorporates some conditions described below.

Figure 5:
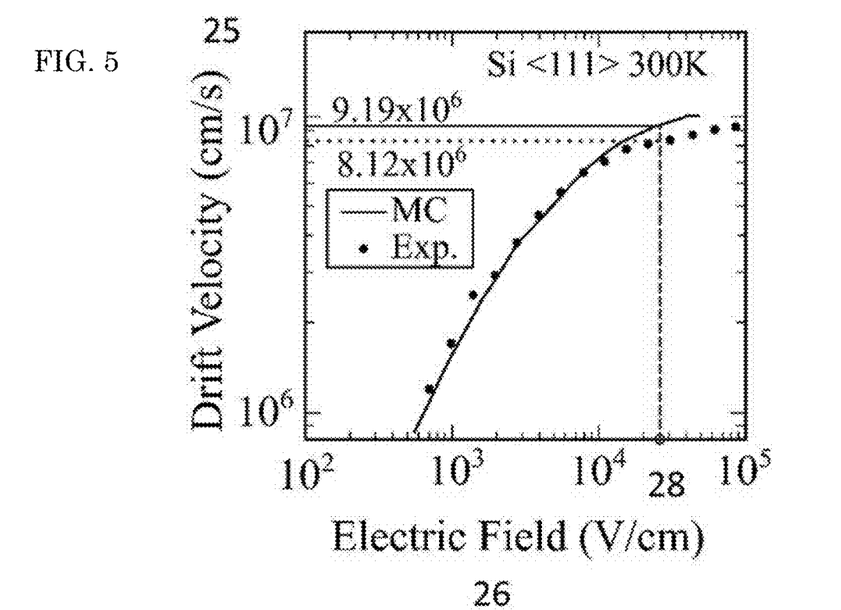
FIG. 5 is a graph showing drift velocity versus field (intrinsic silicon).

A second condition relates to the dependence of a drift velocity of an electron on an electric field. A higher field increases the drift velocity. However, as shown in FIG. 5, the drift velocity 25 approaches a constant value. In the figure, the black dots indicate the values obtained by experiments and the solid line indicates the values given by Monte Carlo simulation.

Figure 6:
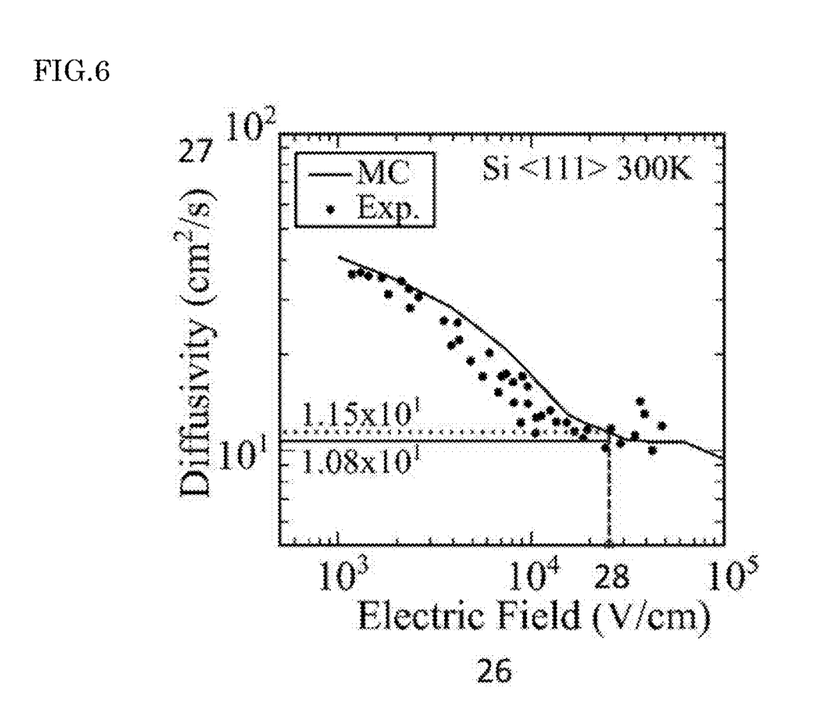
FIG. 6 is a graph showing diffusion coefficient versus field (intrinsic silicon).

On the other hand, as shown in FIG. 6, the vertical diffusion coefficient 27 decreases for the increasing vertical field, and takes a minimum value at a critical field 28. The critical field is about 25 kV/cm for an intrinsic silicon layer as shown in FIG. 5 and FIG. 6.

Around the critical field and for a higher field, the drift velocity is substantially constant.

An expression of the temporal resolution limit disclosed in Non-Patent Literature 2 indicates that a higher drift velocity and a lower diffusion coefficient give a lower standard deviation of the arrival time. Therefore, the temporal resolution takes the minimum value for the critical field.

As explained above, the field of the test sensor is 7.1 kV/cm, which is much lower than the critical field of 25 kV/cm.

The reason is that the field higher than 7.1 kV/cm in the test sensor causes a punch-through of the p-well for the potential separation between the upper photoreceptive layer and the lower functional diffusion layer.

A third condition relates to the thickness of the photoreceptive layer.

Although a thinner photoreceptive layer reduces the time for the drift and the diffusion, it also reduces the sensitivity, since a large part of incident photons passes through the photoreceptive layer.

Therefore, in the Non-Patent Literature 2, the thickness of the photoreceptive layer is assumed equal to the average penetration depth of the incident light Some other conditions are used to specify the value of the temporal resolution limit, such that the photoreceptive layer is an intrinsic silicon with the <111>crystal orientation, which minimizes the temporal resolution, and the incident angle of light is perpendicular to the backside surface.

The distribution of the arrival time is assumed to be Gaussian, and the temporal resolution limit is defined by twice the standard deviation. The temperature is assumed to be 300 degrees K. These conditions may be acceptable as practical imaging conditions.

The Non-Patent Literature 2 presents the expression of the temporal resolution limit of image sensors, which contributes not only to the fundamental physics, but also to practical development of ultra-highspeed image sensors. The derivation process of the expression provides valuable information for the development in practice. The conditions to minimize the temporal resolution are listed and analyzed. Designing a sensor along the analyses allows the temporal resolution automatically to approach the theoretical limit.

4. Crosstalk Associated with BSI MCG Image Sensor

Although the BSI MCG image sensor is a technology to approach the theoretical temporal resolution limit. It has temporal large crosstalk between a pair of successive images and spatial large crosstalk between adjacent pixels.

Four causes result in crosstalk in imaging with the BSI MCG image sensors

A first cause may be the charge collection devices in each pixel closely placed radially about the center. Most signal electrons generated at an instance are collected by a charge collection device to which VH is applied, but some are collected by a different charge collection device to which VH is applied in the next duration.

A second cause may be charge storage devices installed in each pixel. Photons remaining after absorption of the incident photons in the photoreceptive layer directly reach charge storage devices. The first and the second causes are associated with the structure of the BSI MCG image sensors.

A third cause may be crosstalk due to light incident to the pixel boundary area. It is possible for the light to directly enter the neighboring pixel with an angle. Some electrons generated by the light migrate to an adjacent pixel. A fourth cause may be signal mixing in processing image signals after image capturing in devices outside the image sensor. The third and the fourth causes are common in all image sensors, including the BSI MCG image sensors.

To specify the value of the temporal resolution limit, the thickness of the photoreceptive layer is assumed equal to the average penetration depth of the incident light. However, the condition on the thickness competes with the conditions to optimize other performance indices, such as crosstalk.

These tradeoff relations appear more clearly for the BSI MCG image sensors with a plurality of charge collection devices than for other image sensors with one charge collection device.

If the thickness of the photoreceptive layer is equal to the average penetration depth, 37% ($=\exp(-1)$) of the incident photons pass through the photoreceptive layer and reach the front side.

In usual image sensors with one charge collection device, only a small part of the remaining 37% photons generate false signal electrons in the charge collection device. Most of them further travel to the lower layers including an insulation layer made with silicon oxide, an electrode layer made with polysilicon, and a metal layer where the photons scatter due to diffused reflection (not shown, since the structure is common for image sensors). Therefore, the crosstalk may be insignificant.

As shown in FIG. 3, the BSI MCG image sensor includes a silicon layer under the p-well to distribute signal electrons to a plurality of charge collection devices through the inclined charge trajectory 7. The thickness of the silicon layer is more than one micrometer. In the layer, the remaining photons generate false signal electrons. The thickness of the silicon layer for the inclined distribution is dependent on the process node, the difference between the VH and the VL applied to the collection devices, and other conditions.

For example, the silicon layer can be thinner for a finer process node. A process with a 60-nm technology uses a thinner layer for the charge distribution than a process with a 120-nm technology.

When the remaining photons horizontally spread in the relatively thick functional diffusion layer, false signal electrons generated in the collection devices to which the VH is not applied and cause crosstalk.

If the thickness of the photoreceptive layer is twice or three times thicker than the average penetration depth, the portions of the remaining photons are 13.5% (=exp(−2)) for the photoreceptive layer twice the penetration depth, and 5.0% (=exp(−3)) for the photoreceptive layer three times the average penetration depth. Since only a portion of the remaining photons causes the crosstalk, the effect on the captured images becomes practically insignificant.

However, a thicker photoreceptive layer elongates the temporal resolution. Therefore, the thickness of the photoreceptive layer relates to the tradeoff between the frame rate and the crosstalk. In practical design of the BSI MCG image sensors, the thickness of the photoreceptive layer may be one to three times the average penetration depth, depending on their applications.

The conditions other than the thickness of the photoreceptive layer may be specified by referring to the assumptions used in deriving the expression of the temporal resolution limit.

5. ROXNOR Circuit

Patent Literature 3 and Non-Patent Literature 3 each discloses an electric circuit to generate and distribute the voltage VH to a plurality of charge collection devices at a very short time interval in turn. The circuit named "ROXNOR" circuit includes a ring oscillator circuit (RO) and an exclusive NOR circuit.

6. Deep Trench Insulator

A deep trench insulator (DTI) is one technology to effectively suppress the spatial crosstalk. The DTI is a thin vertical wall of the silicon oxide inserted at the pixel borders. Since the refractive index of a silicon layer is much higher than that of a silicon oxide layer, light incident to the DTI cannot escape from the DTI wall and does not enter a neighboring pixel.

In addition, the DTI is doped with high-concentration boron atoms that diffuse to neighboring silicon layers and create a thin vertical p-type layer along the wall.

The thin p-type layer creates a horizontal electric field toward the center of the photoreceptive layer, pushing away the signal electrons from the pixel border. These mechanisms effectively suppress the crosstalk.

7. SOT for BSI Image Sensors

The image sensors with the structure shown in FIG. 1 can have following phenomenon. If a difference between the voltages applied to the backside and the front side is larger than a specific value, signal electrons generated in the photoreceptive layer pass through the p-well and directly reach the circuits on the front side due to punch-through.

A silicon-on-insulator (SOI) structure includes two silicon layers sandwiching an insulator made with silicon oxide. The p-well barrier in FIG. 1 may be replaced by a barrier of a silicon oxide layer, forming a kind of SOI structure. The silicon oxide layer tolerates a much higher field and prevents the punch-through.

8. Apparatuses Based on Time-of-Flight and Lifetime Measurements

The shortest temporal resolution of an existing image sensor that can capture consecutive frames is about 10 ns. Image sensors according to one or more aspects of this invention have the temporal resolution of 100 picosecond (ps) or less, which is less than $1/100$ of the temporal resolution of the existing fastest image sensor. Such ultra-highspeed image sensors may be used in advanced measurement apparatuses There are two types of such measurement apparatuses: one based on time-of-flight (TOF) measurement and the other based on lifetime measurement.

The former includes an imaging TOF MS (Imaging Time-of-Flight mass spectrometry). Common TOF MS uses a short-pulse electron, an X-ray, or a laser beam incident to a small area of a surface of a specimen to generate a plume of ionized atoms or molecules originally consisting of the specimen area. The ions fly in an electric field and reach the detector with different arrival times depending on their mass and charge, allowing estimation of the mass of each ion. For areal mass spectrometry, the beam scans over the area consuming a longer time.

Patent Literature 4 discloses an imaging TOF MS. One pulsed beam applied to a wide area of a specimen instantly generates ions from all over the area. The ions fly, keeping information on the original positions, to reach an image sensor with a very short temporal resolution. If the temporal resolution of the image sensor is sufficiently short, such as 1 ns or less, a mass analysis for all the area completes in one shot of the beam.

The latter includes FLIM (Fluorescence Lifetime Imaging Microscopy) to detect species of fluorescence proteins distribution all over cells and their activities. The decay times of fluorescence proteins are about 1 ns. An image senor of one or more aspects of the invention is suitably used for such analysis.

CITATION LIST

Patent Literature

Patent Literature 1: Japanese Patent No. 6188679 granted on Aug. 30, 2017, entitled SOLID-STATE IMAGING APPARATUS (in Japanese)

Patent Literature 2: U.S. Pat. No. 9,503,663 granted on Nov. 22, 2016, entitled SOLID STATE IMAGING APPARATUS Patent Literature 3: PCT International Application No. PCT/JP2015/055473 filed on Feb. 25, 2015, entitled IMAGING ELEMENT, IMAGE CAPTURING APPARATUS, AND MEASUREMENT SYSTEM Patent Literature 4: Japanese Patent Application No. 2008-517739 and Re-publication of PCT International publication No. 2007/138679 entitled MASS SPECTROMETRY APPARATUS (in Japanese)

Non-Patent Literature

Non-Patent Literature 1: Takeharu G. Etoh, et al., Toward one Giga frames per second-Evolution of in-situ storage image sensors, Sensors, 13(4), 4640-4658, 2013
Non-Patent Literature 2: Takeharu G. Etoh, et al., The theoretical highest frame rate of silicon image sensors, Sensors, 17(3), 2017
Non-Patent Literature 3: C. Zhang, et al., Pixel-parallel localized driver design for a 128×256 pixel array 3D 1 Gfps image sensor, Proc. SPIE10328, Selected Papers from the 31$^{st}$ International Congress on High-speed Imaging and Photonics, 10328-07. Feb. 20, 2020

SUMMARY OF THE INVENTION

1. Aim of the Invention

One or more aspects of the invention are directed to a technique for reducing the temporal resolution of an image sensor measured with a standard deviation of the arrival time of a signal charge to one of charge collection devices.

Another aspect of the invention is directed to suppressing negative side-effects associated with the above technique.

2. Strategy to Achieve the Aim

A fundamental strategy to achieve the aim employs the MCG image sensor structure and modifies it, considering conditions suggested in the theoretical analysis on the temporal resolution limit.

Specifically, the technique suppresses the spread of the travel time of signal charges due to horizontal motion of signal charges.

3. Measures to Achieve the Aim

The invention provides an image sensor comprising:

pixels arrayed in M rows and N columns on a plane, where M and N are positive integers, and when a direction perpendicular to the plane is vertical, and a direction parallel to the plane is horizontal, each pixel including a first semiconductor layer located between a first surface and a second surface extending substantially horizontal, the first semiconductor layer (photoreceptive layer) being configured to allow a photon or a charged particle incident to the first surface to generate one or more pairs of charges, a device configured to apply a vertical electric field to the first semiconductor layer to deplete a part of the first semiconductor layer and thereby increase a speed of the charges in the first semiconductor, and a second semiconductor layer (functional diffusion layer) attached to the second surface, the second semiconductor layer being configured to allow one of one or more pairs of the charges transferred from the first semiconductor layer through the second surface to be collected, stored or converted to an electric signal, wherein the second surface has an area smaller than a half of an area of the pixel and a side of the first semiconductor layer rising from an edge of the second surface forms an angle at least 45 degrees with the second surface.

Such an image sensor effectively suppresses mixing and diffusion due to a horizontal motion of the signal charges, for example, electrons, in the photoreceptive layer toward the center of the functional diffusion layer and effectively reduces the standard deviation of the arrival time of the electrons to the center of the functional diffusion layer, enabling the ultra-fast imaging.

The invention further provides the image sensor, wherein the angle between the side of the first semiconductor layer rising from the edge of the second surface and the second surface is substantially equal to an angle formed by two of crystal orientations of a diamond cubic crystal structure.

This enables relatively easy fabrication of the side wall of the photoreceptive layer with an angle more than 45 degrees.

For example, proper etching of a<100>surface of a material with a diamond cubic structure, such as silicon and germanium, creates a<100>surface with 90 degrees or a <111>surface with 54.7 degrees to the original <100>surface.

The invention further provides the image sensor, wherein the side of the first semiconductor layer rising from an edge of the second surface is covered by an oxide of a material of the first semiconductor layer, and an angle rotating downward from the equi-potential line in the first semiconductor layer to a substantially long reach of a side of the first semiconductor layer is at least 90 degrees, where downward denotes a direction from the first surface to the second surface.

Such an image sensor has the photoreceptive layer with the side wall generating less dark current and reducing trap of the charges to reduce the noise, and pushing away the charges from the side wall to the central layer of the photoreceptive layer to further suppress the horizontal motion and increase the speed of the signal charges to the functional diffusion layer.

The invention further provides the image sensor, wherein the side of the first semiconductor layer rising from the edge of the second surface is surrounded by a third layer formed with an n-type semiconductor when the first semiconductor layer is a p-type semiconductor and with a p-type semiconductor when the first semiconductor layer is an n-type semiconductor, where the shape of the first semiconductor layer is formed with the crystal orientation of a diamond crystal.

The signal charges generated in the photoreceptive layer are pushed to the central layer, suppressing the horizontal motion of the signal charges efficiently.

The invention further provides the image sensor, wherein the second semiconductor layer comprises a plurality of devices to deliver charges, and the plurality of the devices are each placed at substantially the same distance from a center of the second surface and are located radially from the center.

The distance to each device from the center of the functional diffusion layer is equalized and the travel time of the signal charge from the center to each device is also equalized and minimized.

The invention further provides the image sensor, wherein the first surface comprises fine pyramid-shaped roughness.

The roughness reduces an effective penetration depth of the incident light to the photoreceptive layer, which reduces the standard deviation of the arrival time of the signal charges from the photoreceptive area to the functional diffusion layer, and the temporal resolution.

The invention provides an imaging apparatus comprising any one of the above-mentioned image sensors and enables ultra-high-speed imaging.

DETAILED DESCRIPTION

1. First Embodiment

Figure 7:
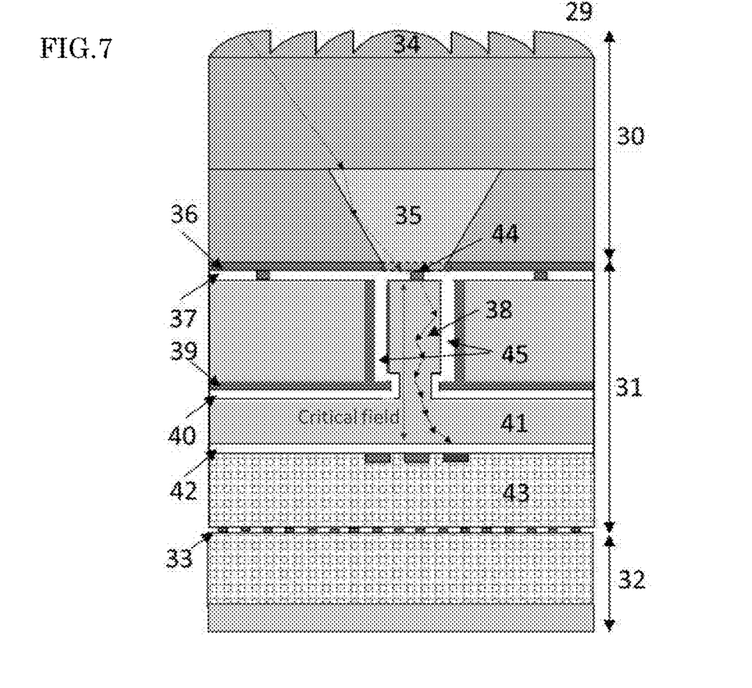
FIG. 7 is a cross-sectional view of an image sensor according to a first embodiment of the invention.

FIG. 7 shows a cross section 29 of a pixel of an image sensor according to a first embodiment of the invention. The image sensor includes three stacked layers: a light collection layer 30, an imaging layer 31, and a driver layer 32. The planar view is shown in FIG. 2.

The imaging layer and the driver layer are electrically connected through a bump layer 33. The light collection layer 30 includes a micro lens 34 and a light guide 35.

The imaging layer comprises a first light shield layer 36 (0.3 micrometers), a first insulation layer 37 (0.1 micrometers), a photoreceptive layer 38 made with a low-concentration n-type silicon layer (7 micrometers), a second light shield layer 39 (0.3 micrometers), a second insulation layer 40 (0.1 micron), a functional diffusion layer 41 (3 micrometers), a third insulation layer 42 (0.01 micrometers), and a metal circuit layer 43 (7 micrometers). The values in parentheses indicate the thicknesses of the layers. The layers from the upper surface of the photoreceptive layer 38 to the bottom of the functional diffusion layer 41 constitute a single connected silicon layer with a total thickness of 10 micrometers.

The light shield layers 36, 39 are made of tungsten. The insulation layers 37, 40, 42 are made of silicon oxide.

The first light shield layer functions as a conductive layer to provide a reverse bias voltage to the backside of the photoreceptive layer and is electrically connected to the backside of the photoreceptive layer through a contact 44.

The photoreceptive layer is a four-micrometer wide square pipe from the first insulation layer to the second insulation layer surrounded by a deep trench insulator (DTI) 45.

A high-concentration p-type layer covers the upper thin surface portions of the photoreceptive layer and the functional diffusion layer and the surface layer of the DTI to suppress dark currents generated in the interfaces due to crystal defects.

FIG. 2 is a plan view of a pixel in the first embodiment. The pixel centers are located at grid points of a square grid rotated by 45 degrees, and the pixel pitch is 18 micrometers. Therefore, one optical pixel area 100 is a square rotated by 45 degrees, and the width of the rotated square is 12.7 micrometers (18 micrometers/SQRT(2)).

The shape and the parameters are also previously explained with reference to FIG. 1 and FIG. 2.

A plurality of ROXNOR circuits are mounted in the driver layer. Each ROXNOR circuit drives charge collection devices in a group of pixels. The ROXNOR circuit and the functions are described in detail in Patent Literature 3 and Non-Patent Literature 3.

2. Second Embodiment

Figure 8:
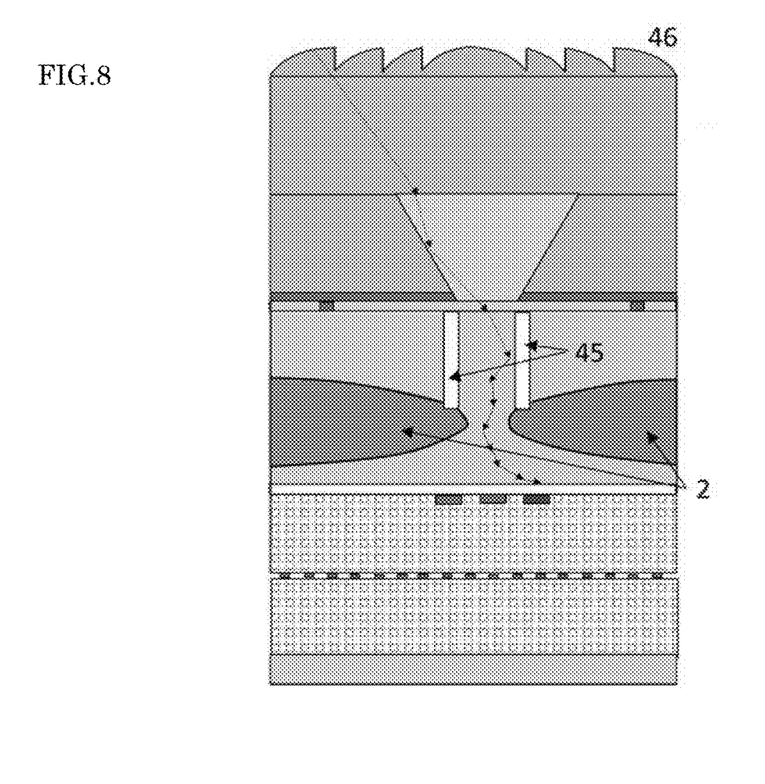
FIG. 8 is across-sectional view of an image sensor according to a second embodiment of the invention.

FIG. 8 shows a cross section 46 of a pixel in a second embodiment of the invention. The structure according to the embodiment includes a p-well 2, having no second light shield and no second insulation layer.

Hereafter, the first and the second embodiments are explained, assuming that the signal charge is an electron. The first and second embodiments achieve similar functions.

A high voltage applied to an electrode of one of the charge collection devices is VH=0 V and a low voltage applied to the electrodes of other charge collection devices is VL=−3 V.

Channels are formed on the bottom surface of the functional diffusion layer and above the electrodes of the charge collection devices.

Figure 10:
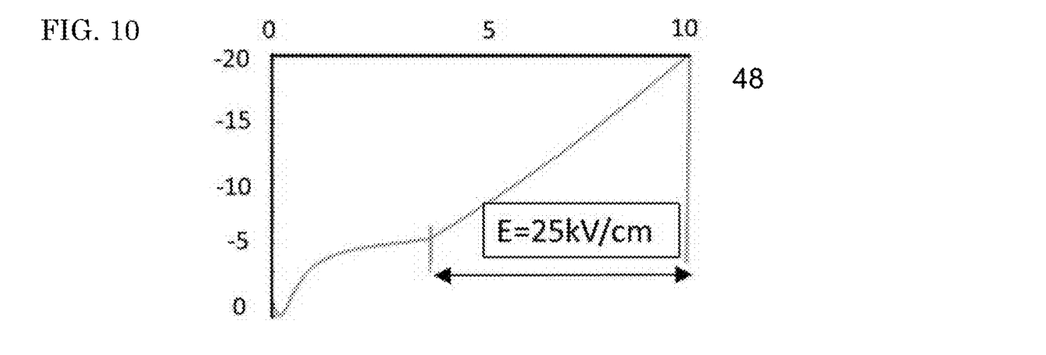
FIG. 10 is a diagram describing an example Monte Carlo simulation according to one or more embodiments of the invention (a vertical potential profile along the pixel center).

A backside voltage applied to the silicon layer (photoreceptive layer) inside the DTI is −20 V, which makes the vertical field in the photoreceptive layer equal to a critical field 28 (=25 kV/cm) as shown in FIG. 10.

Incident light is focused by a micro lens, guided by a light guide to an open area of the backside of a photoreceptive area without a light shield, and mostly converted to signal electrons in the photoreceptive layer inside the DTI.

The average penetration depth to a silicon layer is 1.733 micrometers for green light with a wave length of 550 nm, and is 4.0 micrometers for red light with a wave length of 650 nm. The photoreceptive layer is 7-micrometer thick. Therefore, the thickness of the photoreceptive layer is 4 times the thicknesses of the penetration depth of green light, and is 1.75 times the thickness of the penetration depth of the red light, and thus about 3 times the average penetration depth.

The signal electrons are pushed to the center of the photoreceptive layer by the thin p-layer over the DTI wall and transferred to the functional diffusion layer through a 4-micrometer wide opening of the second insulation layer.

Then, the signal electrons are collected by one of the charge collection devices 7 and transferred to the neighboring charge storage device 9.

In the functional diffusion layer, the trajectory of a signal electron 17 is slanted as shown in FIG. 3. However, as the distance is relatively short, the effect of the motion perpendicular to the average moving direction on the spread of the arrival time is small. This is suggested from the delay appearing in FIG. 4.

A readout operation of image signals and the voltages in the operation after the image capturing operation are described in Patent Literature 1 and Non-Patent Literature 1.

Figure 9:
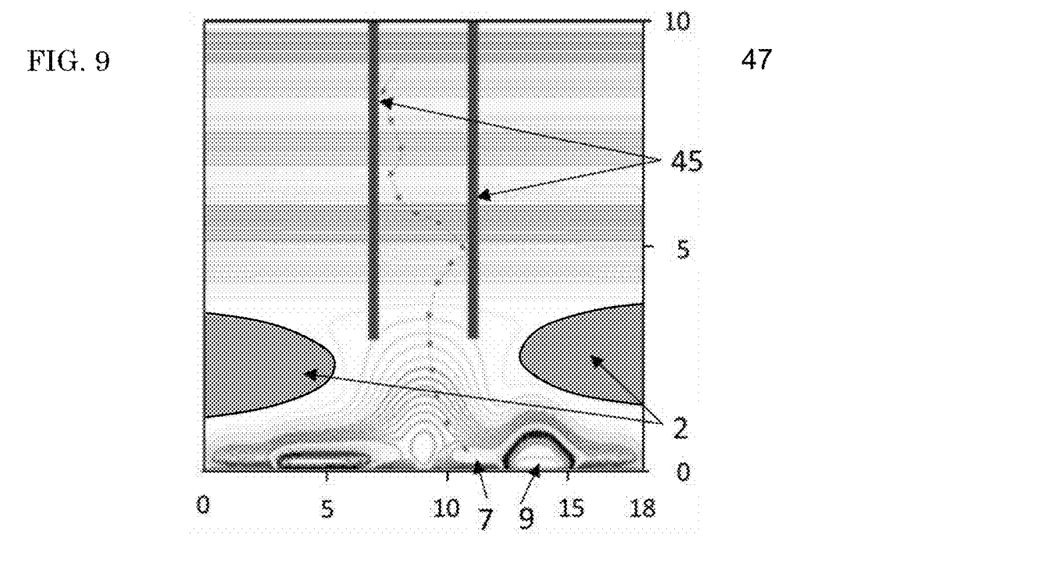
FIG. 9 is a diagram describing an example Monte Carlo simulation according to one or more embodiments of the invention (a cross section view of the potential profile).
Figure 11:
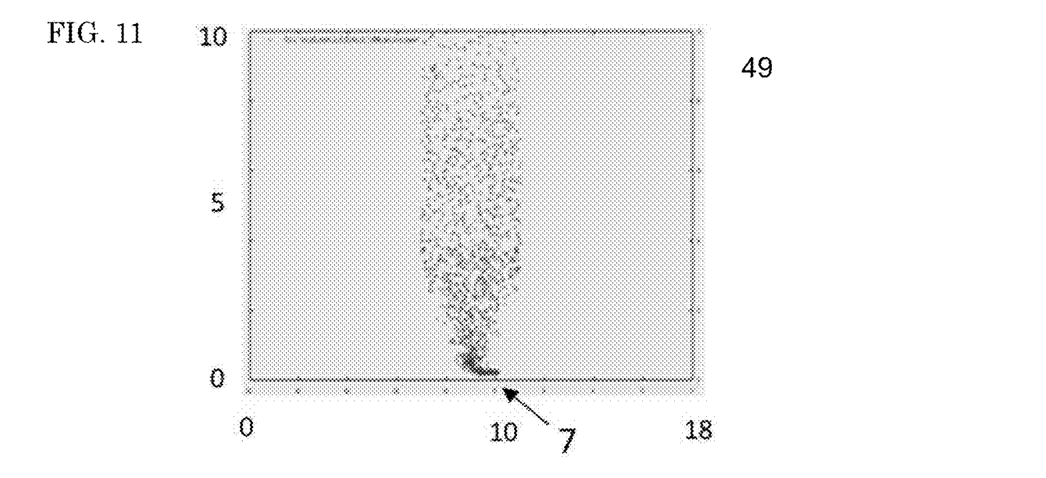
FIG. 11 is a diagram describing an example Monte Carlo simulation according to one or more embodiments of the invention (a distribution of locations of signal electrons).

FIG. 9, FIG. 10 and FIG. 11 show potential profiles and a motion of signal electrons according to the embodiment of the invention calculated by Monte Carlo simulation. Incident light of 550 nm perpendicular to the backside surface enters the photoreceptive layer.

Although, the model shown in FIG. 9 may appear to be the same as in the second embodiment, the sizes and the voltages used in the simulation are similar to those used in the first embodiment.

The backside voltage is −20 V, and the field in the photoreceptive layer is 25 kV/cm as shown in FIG. 10. For the silicon layer outside the DTI in the second embodiment, it is impossible to prevent punch-through for the field of 25 kV/cm with the p-well barrier. Therefore, in the simulation for FIG. 10, the punch-through condition with the p-well is not considered. The same simulation results for the critical field are achieved with a much stronger potential barrier by the second insulation layer 40 that is a silicon oxide layer shown in FIG. 7.

The additional p-well further guides the signal electrons to the center after moving into the functional diffusion layer below the photoreceptive layer.

Therefore, the simulation results shown in FIG. 10 and FIG. 11 correspond to the result for the structure with a p-well as well as a DTI.

The plan structure shown in FIG. 2 is designed with the design rule for the 130-nm process node.

FIG. 9 shows a potential profile 47. FIG. 10 shows a field 48 in the vertical direction at the pixel center from the backside to the front side. FIG. 11 shows locations 49 of signal electrons at 20 ps after instantaneous radiation of light to the backside.

The DTI effectively suppresses the spread of the arrival time of signal electrons due to horizontal mixing. Even in the functional diffusion layer, the inclination of the trajectories distributes between 0 degree to 45 degrees, suggesting that the horizontal component of the motion of the signal electrons is not dominant.

The standard deviation of the arrival time to the charge collection device 7 is 25.2 ps. Therefore, the temporal resolution is 50.4 ps. The theoretical temporal resolution limit is 11 ps. Therefore, the image sensor according to the embodiment achieves the temporal resolution in the same range of the theoretical limit.

A main reason for the temporal resolution to be several-time longer than the theoretical resolution is the thickness of the photoreceptive layer, 7 micrometers, which is 4 times longer than the average penetration depth of green light. If the thickness is equal to the penetration depth, the temporal resolution of this embodiment becomes close to the theoretical limit.

A 130-nm process is assumed in the design according to the embodiment. If a finer process is used, the thickness of the functional diffusion layer can be reduced further, and a shorter temporal resolution is achieved. However, the fabrication may cost more. By optimizing the conditions, while considering these tradeoff relations, the temporal resolution can be reduced further.

Hereafter, a production method according to the first embodiment is described. In a backside process, a silicon layer is etched to the height of the second insulation layer (a silicon oxide layer), leaving a square column, later comprising the photoreceptive layer. The surface of the column and the remaining silicon layer is oxidized to be the second insulation layer 40 and the DTI 45. The surface is covered with a metal layer formed by sputtering to form the second light shield layer 39. The empty space after etching is filled with a polysilicon layer. The backside surface is planarized and covered with the first insulation layer 37 with a contact hole.

The light collection layer can be formed with common technology. The BSI MCG image sensor has large pixels. Thus, the light collection layer can be fabricated separately and later stacked over the backside.

The stacked light collection layer can be incorporated with various optical filters, including color filters and diffracting gratings for scientific applications.

3. Third Embodiment

Figure 12:
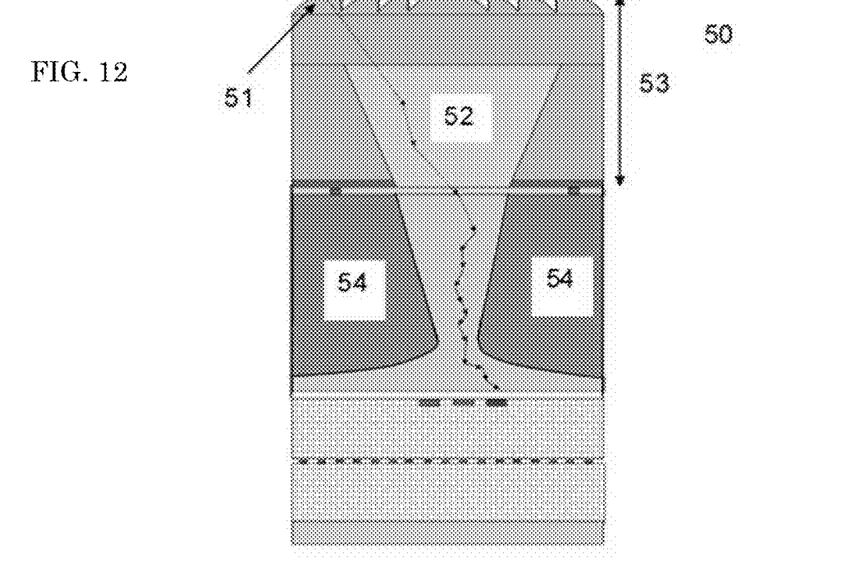
FIG. 12 is a cross-sectional view of an image sensor according to a third embodiment of the invention.

FIG. 12 shows a cross section 50 of a pixel according to a third embodiment of the invention.

A light collection layer 53 includes an on-chip Fresnel lens made with silicon oxide 51 and a light guide with silicon nitride 52.

The structure according to the embodiment also includes a funnel-shaped p-well 54 instead of the DTI. To suppress crosstalk due to spreading incident light, the photoreceptive layer is 30-micrometer thick, which absorbs 99.9% of incident light and leaves only 0.1% reaching the front side even for light of 700 nanometers. However, the thickness results in a slightly long temporal resolution.

A p-well of this special shape is formed as follows: a 3-micrometer thick intrinsic or low-concentration silicon layer is formed through epitaxial growth; boron ions are implanted with a mask with a frame-like opening around the pixel border; the process is repeated while the mask area is being decreased, and; finally, a thermal diffusion process of 12 hours is applied to the whole layers to make a smoothly changing concentration profile.

The reason of the process for the special shape is that the p-well in the third embodiment is too thick to form with implantation of the dopant from the front side. Even for the implantation from the front side with a very high energy, for example, higher than 2 MeV, and a very longtime thermal diffusion, for example, longer than twelve hours, the dopant ions merely reach 5-micrometer deep from the front side.

The signal electrons are generated in the upper and the middle portions of the photoreceptive layer. The funnel-shaped p-well makes most of the trajectories of the signal electrons inclined with about 0 degree to 45 degrees to the vertical line, which suppresses the horizontal motion of the signal electrons. The trajectories of the signal electrons generated in the lower part become close to horizontal. However, the number of such signal electrons is much less due to the very thick photoreceptive layer.

4. Fourth Embodiment

Figure 13:
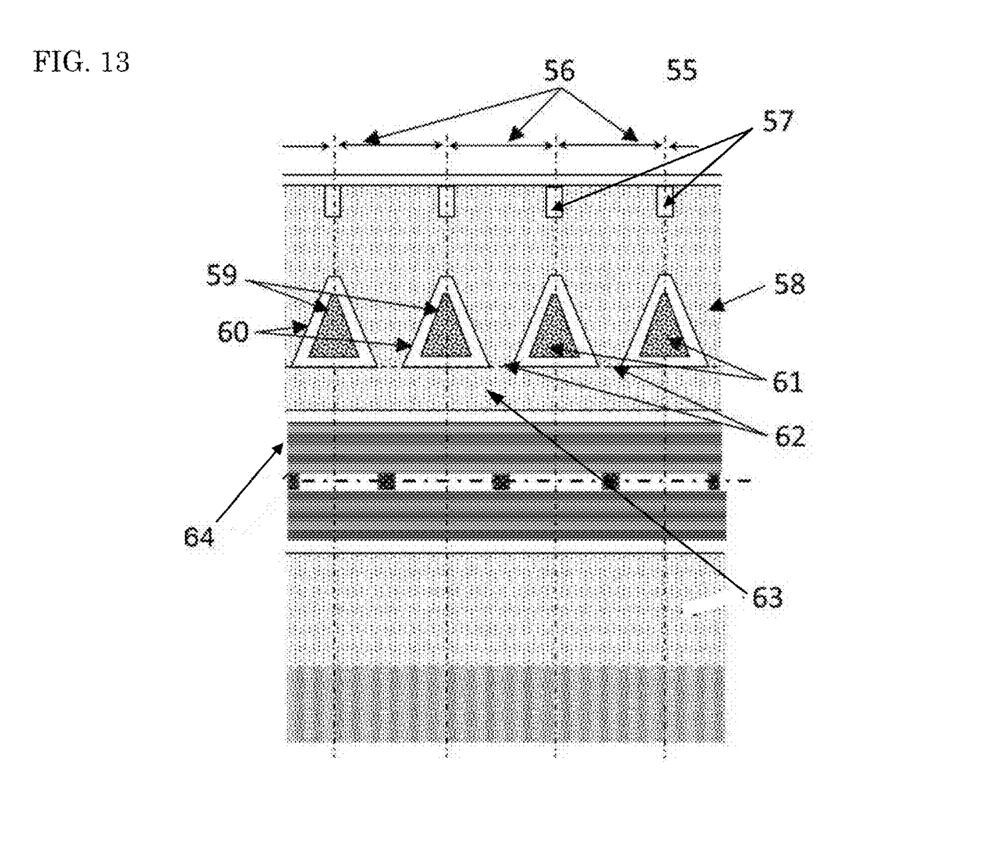
FIG. 13 is a cross-sectional view of an image sensor according to a fourth embodiment of the invention.

FIG. 13 shows a cross section 55 of a pixel according to a fourth embodiment of the invention. The structure includes a DTI 57 in the backside layer of the photoreceptive layer 58 and a funnel-shaped horizontal-motion suppressor 59 in the front side layer.

The funnel-shaped horizontal-motion suppressor 59 is an inverted convex silicon pyramid charge collector with a wide square bottom in the middle of the photoreceptive layer and a narrow square bottom at the front side of the photoreceptive layer, directly attached to the functional diffusion layer. The surface of the pyramid is covered with a silicon oxide layer 60 and an outside part 61 is filled with polysilicon.

In the figure, although the pyramids appear separately, they are connected directly or with a space at the upper bottoms, forming a pyramid array. The bottom of the pyramid in the figure does not reach the backside surface. However, if the pixel size is larger than the thickness of the photoreceptive layer, the pyramid directly may reach the backside without the DTI.

When an appropriate etching process is applied to a silicon surface with a crystal orientation <100>, a <111>surface appears with an angle of about 54.7 degrees to the original surface. By using the technology, the convex pyramid array or concave pyramid-shaped hollows can be made.

Figure 14:
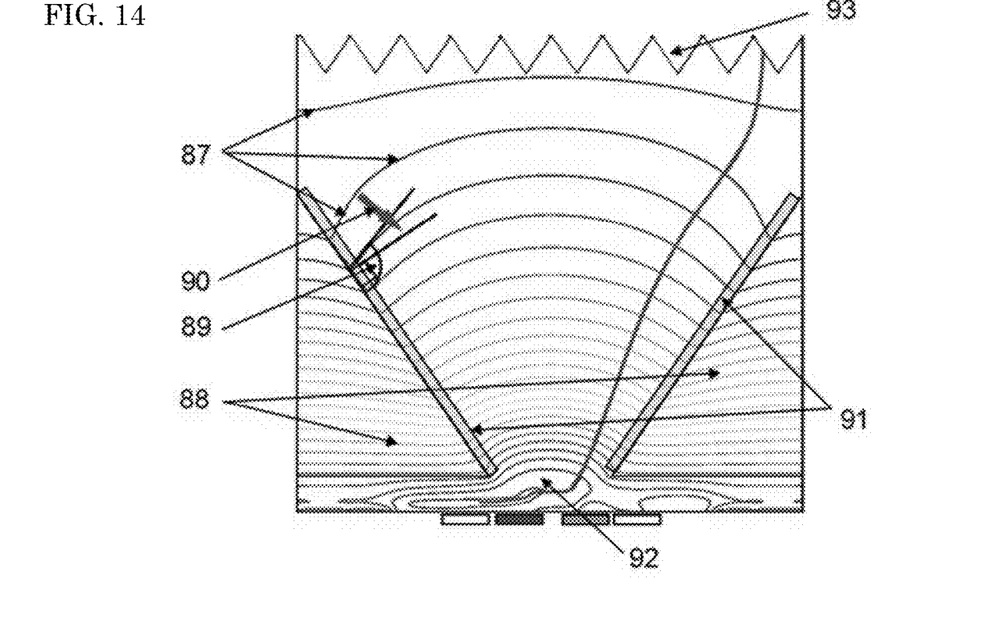
FIG. 14 is a diagram showing equi-potential lines for the image sensor according to the fourth embodiment.

FIG. 14 shows equi-potential lines 87 around a pyramid.

In the figure, the DTI is not shown.

The outside space 88 of the convex pyramid is filled with silicon oxide. The pyramid may be covered with an insulation layer of the silicon oxide and the outside may be filled with polysilicon or other materials instead of silicon oxide.

If the outside space is filled with polysilicon, charges accumulated in the space may be discharged through a wire connected to the outside terminal. Furthermore, by adjusting the concentration of the dopant to the polysilicon and the current through the wire, the potential around the convex pyramid may be modified.

An angle 89 of the equi-potential lines and the surface of the pyramid is larger than 90 degrees along most of the reach of the wall, so that the signal electrons near the wall are pushed away from the surface in the direction 90 to the center.

The angle may be smaller than 90 degrees in a part in which the signal electrons hardly exist near the pyramid surface, such as in an upper part of a pyramid with a light shield with a hole, and in a lower part of the pyramid where signal electrons have been effectively collected around the center with an appropriate potential in the upper and the middle layers of the photoreceptive layer.

The angle of the equi-potential line and the pyramid surface is increased more than 90 degrees by doping a thin and high-concentration boron layer 91 near the surface and by implanting phosphorus ions in a very narrow area of the top of the pyramid 92 from the front side (not shown).

The equi-potential lines may be also abruptly bent by applying hafnium oxide or aluminum oxide over the outside of a very thin silicon oxide insulation layer of the pyramid.

The structure according to the embodiment include a concave pyramid array 93 on the backside surface, which scatters incident light to make an average penetration depth shorter, allowing a shorter photoreceptive layer, and thus a higher image capturing speed.

Hereafter, referring to FIG. 13, the fabrication process according to the embodiment with the convex pyramid charge collector is explained.

A starting wafer A is a p-type wafer with a concentration of about 1018/cm3 (not shown), where ** denotes the power. After the whole process, the wafer A is removed and the surface of the wafer A becomes the backside surface of the image sensor.

A low-concentration silicon layer 58 is developed through epitaxial growth.

The surface of the layer created by epitaxial growth is chemically etched with proper masks to leave an array of convex pyramids. Etching of crystal silicon along a crystal orientation leaves a mirror surface with less defects. For example, a <111>mirror surface with an angle of 54.7 degrees appears after etching of a <100>surface with proper masks. Then, a clearly defined convex pyramid array appears, when viewed from the front side.

Then, the surface 60 is oxidized and the void is filled with polysilicon 61 doped with high-concentration boron ions. The front side surface is planarized. After the top of each pyramid is protected with a mask, the polysilicon layer is etched to the depth of 1 micrometer, and a silicon oxide layer is added over the surface to make the surface higher than the height before the etching of the polysilicon layer. Then, the surface is planarized so that the polysilicon part is covered with a remaining silicon oxide insulation layer and the top of the pyramid of the front side is exposed after etching of the thin silicon oxide layer.

Another wafer B (not shown) is prepared with a low-concentration silicon layer 63 made with epitaxial growth on the surface. The wafers A and B are attached and bonded with a high-temperature thermal process. Then, the top surfaces of the pyramid 62 and the surface of the epitaxial layer of the wafer B are firmly bonded. During the thermal diffusion, boron ions in the polysilicon diffuse to the surface of the epitaxial layer 63 of the wafer B.

The planarization may be applied immediately after the void is filled with polysilicon. In the case, the surface of the epitaxial layer over the wafer B is doped with high-concentration boron ions, except the part connecting to the top of the pyramid 63.

The wafer B is removed with etching and chemical mechanical polishing (CMP). The surface is oxidized and covered with a metal wire layer 64.

The surface is further stacked with another chip including driver circuits, AD converters, memory devices, and other elements (not shown in FIG. 3).

5. Other Embodiments of the Invention

Figure 15:
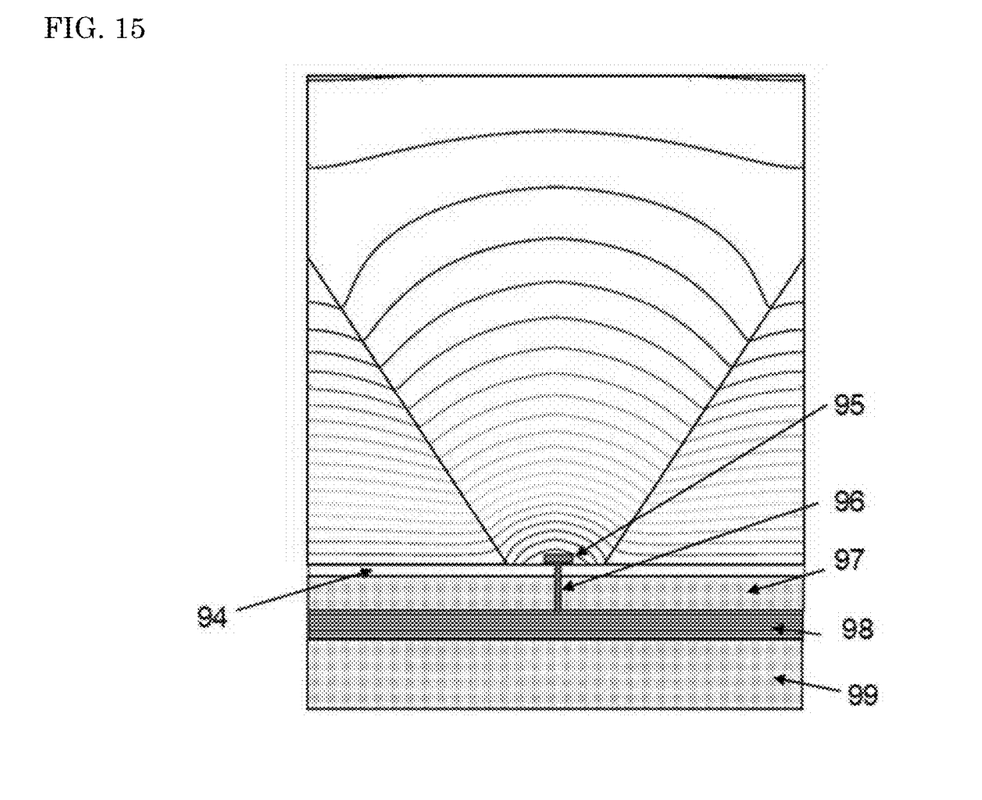
FIG. 15 is a diagram showing an application example of the fourth embodiment to a SOI structure.

The front side structure may be formed with SOI technology. In FIG. 15, the top of the pyramid is covered with silicon oxide 94. The signal electrons are transferred to the silicon functional diffusion layer 97 beneath the pyramid and further to the lower layer through an electrode 95 on the silicon oxide layer at the top of the pyramid and a metal wire 96 passing through the silicon oxide. An issue with the technology is a higher noise than noise associated with the direct transfer of the signal electrons purely through silicon layers, in which a noiseless charge transfer is theoretically possible.

The figure shows a metal circuit layer 98 and a stacked chip 99 such as a driver circuit chip without details.

Signal amplification is also possible with a field much higher than 25 kV/cm in a silicon column in FIG. 7 or in a photoreceptive layer with a pyramid in FIG. 14, which generates secondary electrons or electronic avalanche.

Further, a time-stamping circuit may be installed in the functional diffusion layer under the silicon column or pyramid as employed in single-photon avalanche diode (SPAD) devices.

Further, electrodes may be attached on the lower wall of the silicon column or pyramid.

Consequently, as a horizontal motion of the signal electrons is the greatest factor against ultra-high-speed imaging, the suppression is the most effective strategy to reach the ultimate high-speed.

Furthermore, a macro-pixel configuration may be employed with macro-pixels each including 2×2 or 3×3 element pixels. Each element pixel may work for different functions, at different frequencies to detect the phenomena of different time scales.

A guide gate may be placed at the center of the charge collection devices.

On the other hand, a drain may be placed at the center, instead of the guide gate, by removing the silicon oxide at the center. In the case, during an image capturing operation, a low voltage is applied to the drain to avoid flow of the signal electrons into the drain.

In the first embodiment and the second embodiment, the charge collection devices may be gates with buried depleted channels under the electrodes. The charge collection devices may be typical transistors, in which the signal electrons at the guide gate are transferred by the switching operations of the transistors. In the case, complete transfer of the signal electrons takes time. However, the crosstalk may be reduced.

Some of these structures may be described are disclosed in Patent Literature 1, Patent Literature 2 and Non-Patent Literature 3.

Incident light may be visible light, a soft X-ray, or infrared light, and may be replaced by ion beams, electron beams, or charged particles. Visible light may be used for other incident electromagnetic waves by inserting a scintillator or a special filter in front of the image sensor according to the embodiments of the invention.

6. Imaging Apparatus

Figure 16:
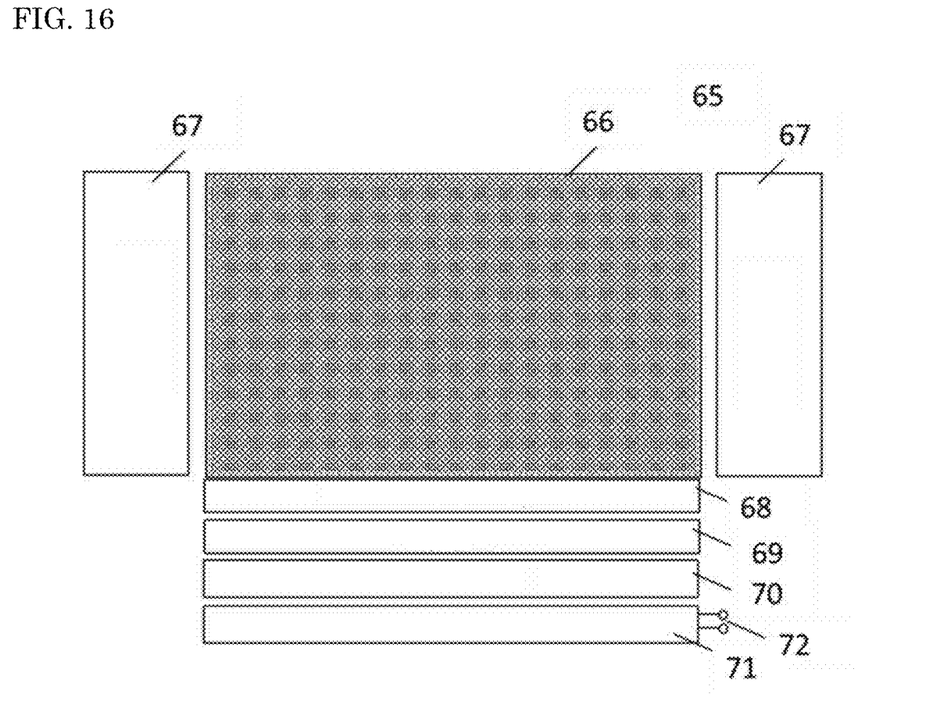
FIG. 16 is a schematic diagram of an image sensor according to one or more embodiments of the invention.
Figure 17:
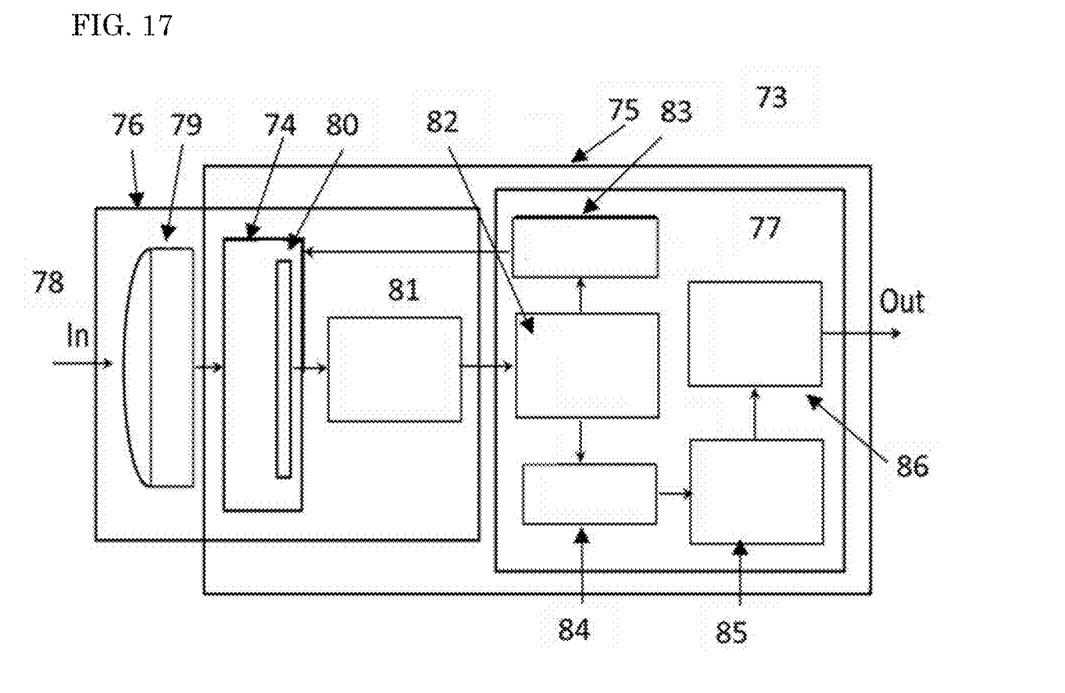
FIG. 17 is a block diagram of a camera according to one or more embodiments of the invention.

FIG. 16 shows an overall view 65 of an image sensor according to one or more embodiments of the invention. FIG. 17 shows an imaging apparatus (camera) 73 incorporating the image sensor. The description based on the figures are simplified, since similar figures are presented in Patent Literature 1, Patent Literature 2 and Patent Literature 3.

An imaging part 66 includes an array of 512×576×2 (589,824) pixels shown in FIG. 2 and FIG. 7. A multiplier 2 is for a staggered interlaced pixel configuration in which pixels on odd-number columns and pixels on even-number columns are placed at staggered positions. Therefore, the pixel centers are placed at grid points of a square grid rotated by 45 degrees. The size of the whole photoreceptive area is 9.216 mm×10.368 mm (=(512×18 micrometers)×(576×18 micrometers)).

Two control devices 67 to control the electrodes in the imaging part are placed on both sides of the imaging part. A readout circuit device to read image signals stored in the pixels out of the image sensor is placed under the imaging part, including an analogue data process device 68, AD converters 69, a line memory 70, a communication device (LVDS) 71, and communication terminals 72.

A camera 73 includes an imaging block 76 and a control block 77. The image sensor is operated by voltages delivered by a driver block 83. Incident light 78 passes a optical block and enters the image sensor 80 mounted in the package 74. The light is converted in the image sensor to image signals, which are temporarily stored in the charge storage device 9 in FIG. 2.

After an image capturing operation is stopped, the image signals are read out of the signal storage device by a main processor (AEF TG) 82 to the buffer memory 81 outside the image sensor. The image signals are rearranged for a high-speed readout and high-quality image frames in DSP 84, stored in a frame memory 85, converted to images in a frame pattern designated by the user with a graphic engine 86, and displayed on a monitor (not shown).

FIG. 16 and FIG. 17 show the standard structures of the camera, having many variations of the structures. For example, when the camera is applied to imaging TOF MS, the optical device is not necessary, and the image sensor is placed in a vacuum tube.

A temporal resolution of 10 ns is shortest for the existing high-speed image sensors that can capture consecutive frames. The image sensor according to the embodiments of the invention achieves the temporal resolution of 100 ps, which is 1/100 of the current shortest temporal resolution. The sensor may be used in advanced analytical apparatuses based on TOF (Time-of-Flight) and lifetime measurements.

Normally, a field less than 25 kV/cm is applied to the photoreceptive layer of the image sensor according to the embodiments of the invention. In image sensors for scientific measurements, much higher field can be applied to amplify the number of signal electrons with secondary charges generated by impact ionization. When the signal level is less than the noise level generated in the readout circuit, the signal cannot be detected, even if the signal level is more than the level of the original noise. However, when the signal is amplified to the level higher than the readout noise level, the signal can be detected, although both the signal and the original noise are amplified together. Such a sensor can detect a single photon.

A further higher field generates electronic avalanche. The electronic avalanche device may also be incorporated with the multi-collection-gate structure and the horizontal-motion suppression device according to the embodiments of the invention to make an ultra-high-speed SPAD image sensors.

On the other hand, the dark current can be reduced by using a lower field.

Multiple collection gates (MCG) can be operated at different time intervals. For example, the MCG image sensor is applied to distance measurement by operating some of the MCGs at a shorter time interval and others at a longer time interval to measure a short distance and a middle-range distance at the same time, keeping the similar accuracy for both distant measurements.

REFERENCE SIGNS LIST

1. A cross section of a BSI MCG image sensor
2. A p-well with a center hole
3. A functional diffusion layer under the p-well
4. Signal charges
5. A plan view of the front side of the BSI MCG image sensor
6. A pixel center
7. A charge collection device to which VH is applied
8. Charge collection devices to which VL is applied
9. Charge storage devices.
10. Charge readout devices
11. A backside
12. Incident light
13. A vertical moving direction of signal electrons in a photoreceptive layer
14. A slightly moving inclined horizontal direction of signal electrons over the p-well
15. A vertical moving direction of signal electrons in a p-well center hole
16. A p-well center hole
17. An inclined direction of signal electrons toward the charge collection device to which VH is applied
18. Twice of a standard deviation of a Gaussian distribution
19. An average time of signal electrons generated by the first light arriving at the front side 20. An average time of signal electrons generated by the second light arriving at the front side
21. The second light incident to the backside
22. Signal electrons generated by the first light incident to the backside
23. Signal electrons generated by the first light arriving at the front side
24. Signal electrons generated by the second light arriving at the front side
25. Drift velocity
26. Electric field
27. Diffusion coefficient
28. A critical field (the field at which the diffusion coefficient to take the minimum value)
29. A cross section of the first embodiment of this invention
30. A light collection block of this invention
31. An imaging block of this invention
32. A driver block of this invention
33. Bumps electrically connecting the sensor chip and the driver chip
34. A micro-lens
35. A light guide
36. The first light shield layer
37. The first insulation layer
38. A photoreceptive layer
39. The second light shield layer
40. The second insulation layer
41. A functional diffusion layer
42. The third insulation layer
43. A metal layer
44. A contact point to provide a voltage to the backside of the inside of DTI
45. DTI
46. A cross section of the second embodiment of this invention
47. A potential distribution for the condition corresponding to that of the first embodiment
48. A potential profile along a vertical line at the center of the pixel
49. A spatial distribution of signal electrons
50. A cross section of the third embodiment of this invention
51. An on-chip Fresnel lens
52. A Light guide
53. A light collection device
54. A funnel-like p-well
55. A cross section of the fourth embodiment of this invention
56. A pixel
57. DTI
58. A photoreceptive layer
59. Funnel-like horizontal motions suppresser
60. An insulation layer
61. Polysilicon
62. A top surface of a convex pyramid
63. An epitaxial layer
64. A metal wiring layer
65. A whole image sensor
66. An imaging device
67. A control device
68. An analogue processor
69. An AD converter
70. A line memory
71. LVDS
72. A communication terminal
73. A camera
74. A package
75. A main body of the camera
76. An imaging block
77. A control block
78. Incident light
79. An optical device
80. An image sensor of this invention
81. A buffer memory
82. A main processor
83. A driver circuit for the image sensor
84. DSP (Digital image signal processor)
85. An image signal storage device
86. A graphic engine
87. An equi-potential line in a convex charge collector
88. An oxide layer around the convex charge collector
89. An angle between an equi-potential line and a surface of the convex charge collector
90. An electron approaching the convex charge collector
91. A thin Boron-doped layer on the convex charge collector
92. An opening of a silicon layer at the bottom of the convex charge collector
93. Concave pyramid array at the backside
94. A silicon oxide layer at the bottom of the convex charge collector
95. An electrode at the bottom of the convex charge collector
96. A vertical wire passing through the silicon oxide layer at the bottom
97. A wire transferring signal electrons
98. A metal wiring layer
99. A stacked chip such as driver circuit chip
100. One optical pixel area

What is claimed is:

1. An image sensor comprising:
pixels arrayed in M rows and N columns on a plane, where M and N are positive integers, and when a direction perpendicular to the plane is vertical, and a direction parallel to the plane is horizontal, each pixel including
a first semiconductor layer located between a first surface and a second surface extending substantially horizontal, the first semiconductor layer being configured to allow a photon or a charged particle incident to the first surface to generate one or more pairs of charges,
a device configured to apply a vertical electric field to the first semiconductor layer to deplete a part of the first semiconductor layer and thereby increase a speed of the charges in the first semiconductor, and
a second semiconductor layer attached to the second surface, the second semiconductor layer being configured to allow one of one or more pairs of the charges transferred from the first semiconductor layer through the second surface to be collected, stored or converted to an electric signal,
wherein the second surface has an area smaller than a half of an area of the pixel and a side of the first semiconductor layer rising from an edge of the second surface forms an angle at least 45 degrees with the second surface, and
wherein the angle between the side of the first semiconductor layer rising from the edge of the second surface and the second surface is substantially equal to an angle formed by two of crystal orientations of a diamond cubic crystal structure.

2. An image sensor comprising:
pixels arrayed in M rows and N columns on a plane, where M and N are positive integers, and when a direction perpendicular to the plane is vertical, and a direction parallel to the plane is horizontal, each pixel including a first semiconductor layer located between a first surface and a second surface extending substantially horizontal, the first semiconductor layer being configured to allow a photon or a charged particle incident to the first surface to generate one or more pairs of charges, a device configured to apply a vertical electric field to the first semiconductor layer to deplete a part of the first semiconductor layer and thereby increase a speed of the charges in the first semiconductor, and a second semiconductor layer attached to the second surface, the second semiconductor layer being configured to allow one of one or more pairs of the charges transferred from the first semiconductor layer through the second surface to be collected, stored or converted to an electric signal, wherein the second surface has an area smaller than a half of an area of the pixel and a side of the first semiconductor layer rising from an edge of the second surface forms an angle at least 45 degrees with the second surface, wherein the side of the first semiconductor layer rising from an edge of the second surface is covered by an oxide of a material of the first semiconductor layer, and wherein an angle rotating downward from an equi-potential line in the first semiconductor layer to a substantially long reach of the side of the first semiconductor layer is at least 90 degrees, where downward denotes a direction from the first surface to the second surface.

3. The image sensor according to claim 1,
wherein the side of the first semiconductor layer rising from the edge of the second surface is surrounded by a third layer formed with an n-type semiconductor when the first semiconductor layer is a p-type semiconductor and with a p-type semiconductor when the first semiconductor layer is an n-type semiconductor.

4. The image sensor according to claim 1,
wherein the second semiconductor layer comprises a plurality of devices to deliver charges, and the plurality of the devices are each placed at substantially the same distance from a center of the second surface and are located radially from the center.

5. The image sensor according to claim 1,
wherein the first surface comprises fine pyramid-shaped roughness.

6. An imaging apparatus comprising the image sensor according to claim 1.

7. The image sensor according to claim 1,
wherein the second semiconductor layer comprises a plurality of devices to deliver charges, and the plurality of the devices are each placed at substantially the same distance from a center of the second surface and are located radially from the center.

8. The image sensor according to claim 2,
wherein the second semiconductor layer comprises a plurality of devices to deliver charges, and the plurality of the devices are each placed at substantially the same distance from a center of the second surface and are located radially from the center.

9. The image sensor according to claim 3,
wherein the second semiconductor layer comprises a plurality of devices to deliver charges, and the plurality of the devices are each placed at substantially the same distance from a center of the second surface and are located radially from the center.

10. The image sensor according to claim 1,
wherein the first surface comprises fine pyramid-shaped roughness.

11. The image sensor according to claim 2,
wherein the first surface comprises fine pyramid-shaped roughness.

12. The image sensor according to claim 3,
wherein the first surface comprises fine pyramid-shaped roughness.

13. The image sensor according to claim 4,
wherein the first surface comprises fine pyramid-shaped roughness.

14. An imaging apparatus comprising the image sensor according to claim 1.

15. An imaging apparatus comprising the image sensor according to claim 2.

16. An imaging apparatus comprising the image sensor according to claim 3.

17. An imaging apparatus comprising the image sensor according to claim 4.

18. An imaging apparatus comprising the image sensor according to claim 5.

* * * * *